US006487687B1

United States Patent
Blake et al.

(10) Patent No.: US 6,487,687 B1
(45) Date of Patent: *Nov. 26, 2002

(54) VOLTAGE LEVEL SHIFTER WITH TESTABLE CASCODE DEVICES

(75) Inventors: Terence G. W. Blake, Dallas, TX (US); Bernhard H. Andresen, Dallas, TX (US); Frederick G. Wall, Garland Dallas County, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/314,309

(22) Filed: May 19, 1999

Related U.S. Application Data

(60) Provisional application No. 60/086,878, filed on May 27, 1998, provisional application No. 60/034,170, filed on Jan. 2, 1997, now Pat. No. 6,040,708, and provisional application No. 60/035,735, filed on Jan. 2, 1997, now Pat. No. 5,995,010.

(51) Int. Cl.[7] ............................................. G01R 31/28
(52) U.S. Cl. ........................ 714/724; 324/769; 326/68
(58) Field of Search ........................ 714/724; 324/769, 324/158.1, 73.1; 323/315; 326/75, 124, 63.8, 126–127, 18, 89, 90, 68; 330/288, 257, 149, 311; 340/653; 327/318–320, 322, 325, 327, 331

(56) References Cited

U.S. PATENT DOCUMENTS

| 4,345,217 A | * | 8/1982 | Pace .......................... 330/288 |
| 5,524,094 A | * | 6/1996 | Nobukata et al. ...... 365/185.17 |
| 5,764,077 A | | 6/1998 | Andresen et al. ............. 326/34 |
| 5,995,010 A | * | 11/1999 | Blake et al. ................ 324/73.1 |
| 6,100,716 A | * | 8/2000 | Adham et al. ............... 326/126 |
| 6,211,693 B1 | * | 4/2001 | Andresen et al. ......... 324/158.1 |

OTHER PUBLICATIONS

08/516,514, "High Voltage Tolerant Output with Enhanced Testability and Reliability," filed Aug. 17, 1995, Under Appeal (not included) (abandoned).

* cited by examiner

*Primary Examiner*—Albert Decady
*Assistant Examiner*—Guy Lamarre
(74) *Attorney, Agent, or Firm*—Robert D. Marshall, Jr.; W. James Brady, III; Frederick J. Telecky, Jr.

(57) ABSTRACT

A voltage level shifter with testable cascode devices is disclosed. According to one embodiment, the level shifter includes multiple cascode devices and switches a first output driver according to the values of a data input and an enable input. Testability devices coupled to cascode devices of the level shifter detect a current in response to failure of the corresponding cascode device.

13 Claims, 2 Drawing Sheets

VOLTAGE LEVEL SHIFTER WITH TESTABLE CASCODE DEVICES

RELATED APPLICATIONS

This application claims priority under 35 USC §119(e)(1) of Provisional Application Number 60/086,878, filed May 27, 1998.

This application is related to a provisional application entitled Output Buffer Having Quasi-Failsafe Operation, filed Jan. 2, 1997, having a Ser. No. of 60/034,170, and now U.S. Pat. No. 6,040,708, and a provisional application entitled Output Buffer Providing Testability, filed Jan. 2, 1997, having a Ser. No. of 60/035735, and now U.S. Pat. No. 5,995,010.

TECHNICAL FIELD OF THE INVENTION

This invention relates generally to the field of electronic circuits, and more particularly to a level shifter providing testability.

BACKGROUND OF THE INVENTION

Modern ICs often interface with complementary metal-oxide semiconductor (CMOS) voltage levels on chips from previous technology generations. In order to interface with such voltage levels, ICs must include output buffers capable of driving high to an output much greater than the source voltage.

Many output buffer circuits are coupled to one or more power supplies and use output drivers to switch an output voltage according to the values of one or more inputs. For example, an output buffer that receives a high voltage (VDDHV) from a first power supply and an internal chip core voltage (VCG) from a second power supply might have p-channel and n-channel output drivers to switch an output voltage according to values of a data input and an enable input. Typically, output buffers have only a single thin gate oxide. The single thin gate oxide becomes overstressed by a gate-drain voltage much above the source voltage. It is often desirable to protect the gate oxides of these output drivers and other components of the output buffer from overstress, breakdown or other damage due to changes in voltage on the output. Typically, the gate oxide of a transistor can withstand DC voltages only up to approximately VCG plus a transistor threshold voltage (VT).

As microelectronic devices become increasingly complex to satisfy additional processing requirements, reducing the failure of devices during operation becomes increasingly important. A known technique for protecting the gate oxide of output drivers includes coupling cascode devices in series with the output drivers, and in a level shifter, to turn off the switching output P-driver. The cascode devices are supposed to prevent their drains from being pulled past their gate potentials and overstressing the gate oxides of neighboring devices. The cascode devices thus shield the gate oxide of the output driver from voltage levels on the output. The gate of the cascode is maintained at a substantially constant intermediate voltage, such that the voltage across the gate oxide does not exceed the gate oxide's maximum fixed voltage tolerance.

Although these techniques protect the output driver gate oxide when the cascode devices are functioning properly, the output driver is susceptible to oxide stress and failure if the cascode devices in the level-shifter are shorted, even though the output buffer may appear to be functioning properly. Furthermore, such techniques do not provide for detection of cascode failure, leaving previous output buffers and the associated electronic devices prone to unexpected failure during operation. These and other inadequacies make existing output buffers and associated level shifters unsuitable for many applications.

SUMMARY OF THE INVENTION

Therefore, a need has arisen for a level shifter output buffer that addresses the disadvantages and deficiencies of previous systems.

A method for testing a level shifter having a plurality of cascode devices is disclosed. According to one embodiment of the present invention, the level shifter is operable to couple a data input and an enable input to an output buffer and operable to receive a first voltage from a first reference supply and a second voltage from a second reference supply. A first testability device is coupled to a cascode device of the level shifter and to a substantially constant test reference supply. A test current is detected in response to failure of the cascode device.

The level shifter and method of the present invention provide a number of technical advantages. The level shifter includes one or more testability devices that each correspond to a cascode device of the level shifter. Each testability device generates current in response to failure of the corresponding cascode device to indicate failure of the cascode device. The current is detectable as increased or decreased current on an associated reference supply. Since the cascode devices of the level shifter protect the gate oxides of the corresponding devices of the level shifter, respectively, and since the failure of any one of these cascodes will leave the output buffer and associated electronic device susceptible to failure during operation, providing for testability of the condition of the output buffer is a technical advantage.

Another technical advantage of the present invention is that the testability devices pass current sufficient for test detection. Another technical advantage is that the invention can detect multiple failures of cascode devices by providing detectable current on an upper power supply.

BRIEF DESCRIPTION OF THE DRAWINGS

For a more complete understanding of the present invention and for further features and advantages thereof, reference is now made to the following description taken in conjuction with the accompanying drawings, in which.

DETAILED DESCRIPTION OF THE INVENTION

Figure 1:
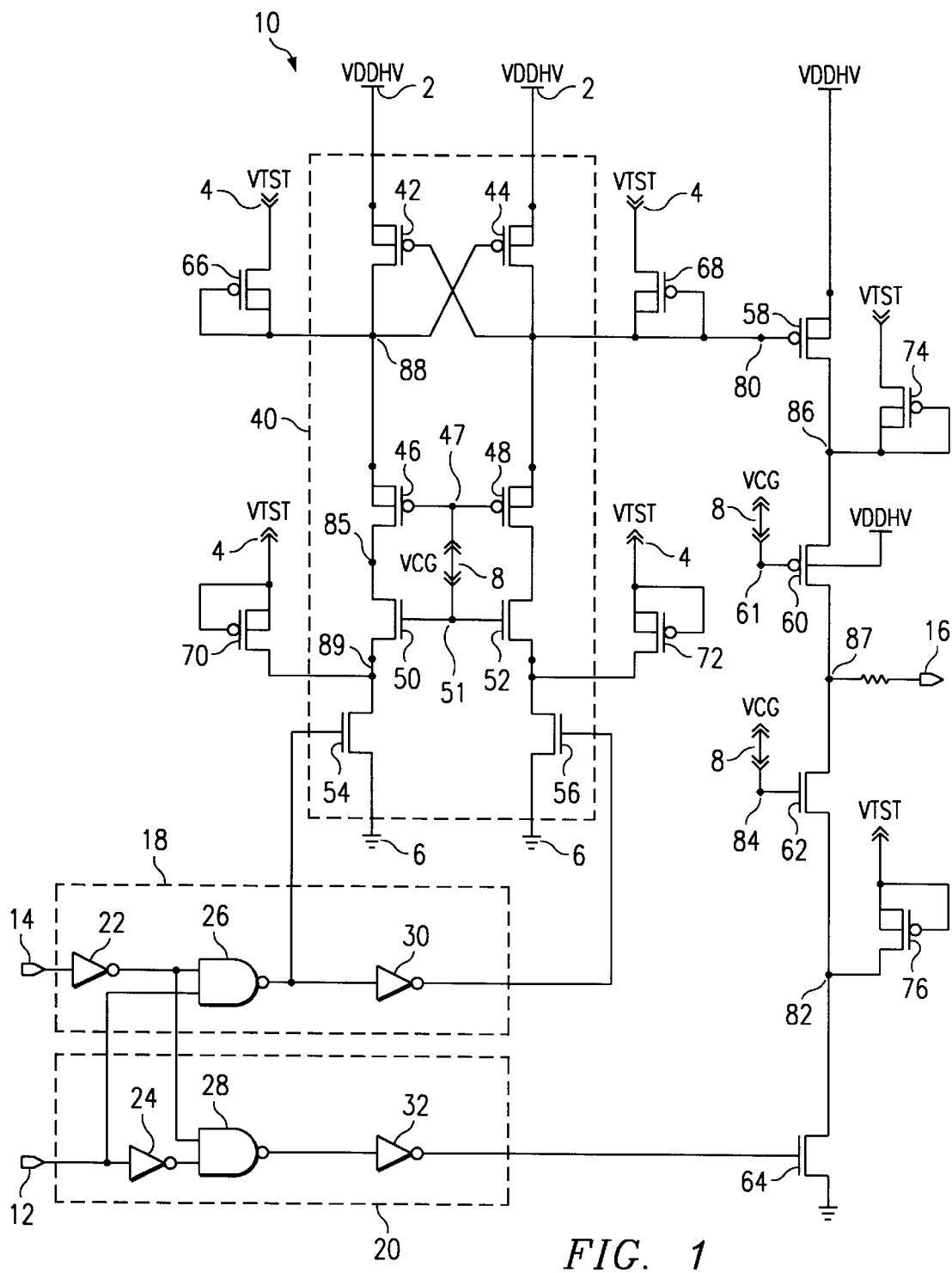
FIG. 1 is a schematic diagram of a first output buffer circuit constructed in accordance with the present invention.

FIG. 1 illustrates an exemplary output buffer 10 for complementary metal-oxide semiconductor (CMOS) applications coupled to a high voltage power supply that provides a voltage (VDDHV) of approximately 3.0V to approximately 3.6V to output buffer 10. Output buffer 10 is coupled to a data input 12, an enable input 14, and an output 16. Data input 12, enable input 14 or both data input 12 and enable input 14 may have a low or "0" value corresponding to ground or any other suitable reference voltage, or a high or "1" value that corresponds to the chip core voltage (VCG) of the electronic device that contains output buffer 10, which may be approximately 1.65V to approximately 1.95V for typical applications. In one embodiment, VDDHV is approximately 3.3V and VCG is approximately 1.8V, which is approximately one-half of VDDHV. The present invention contemplates any suitable combination of VDDHV and VCG.

In general, output buffer 10 converts a voltage signal at level VCG on data input 12 to a higher voltage signal on output 16. The devices that form output buffer 10 may have any dimensions suitable to provide output buffer 10 with adequate drive strength, adequate speed in switching output between low and high according to values of data input and enable input, and acceptably low leakage current when output is in a high-impedance or non-asserted state.

Output buffer 10 includes p-channel pre-driver logic (PPDL) 18 having inverter 22, NAND gate 26, and inverter 30. PPDL 18 couples data input 12 and enable input 14 to switching n-channels 54 and 56 of level shifter 40. Output buffer 10 also includes n-channel pre-driver logic (NPDL) 20 having inverter 24, NAND gate 28, and inverter 32. NPDL 20 couples data input 12 and inverter 22 of PPDL 18 to an n-channel output driver (NCOD) 64. Other appropriate elements may replace or combine with inverters 22 and 24, NAND gates 26 and 28, and inverters 30 and 32 according to particular needs.

Output buffer 10 also includes a level shifter 40 designed to provide VDDHV to the gate (node 80) of a p-channel output driver (PCOD) 58 to switch PCOD 58 according to the values of data input 12 and enable input 14. Level shifter 40 includes p-channel pull-ups 42 and 44, p-channel cascodes 46 and 48, n-channel cascodes 50 and 52, and switching n-channels 54 and 56. P-channel pull-ups 42 and 44 are coupled to power supply (VDDHV) 2, and switching n-channels 54 and 56 are coupled to a ground or any other suitable reference voltage 6. Level shifter 40 may include p-channel metal-oxide-semiconductor (PMOS) and n-channel metal-oxide-semiconductor (NMOS) devices in any suitable combination.

Output buffer 10 also includes switching driver circuitry. The circuitry includes PCOD 58, p-channel output cascode (PCOC) 60, n-channel output cascode (NCOC) 62 and NCOD 64.

Output buffer 10 further includes testability devices 66, 68, 70, 72, 74 and 76, singly or in any suitable combination, that allow for monitoring of p-channel cascode 46, p-channel cascode 48, n-channel cascode 50, n-channel cascode 52, PCOC 60, and NCOC 64, respectively, to detect one or more failure modes. Testability devices 66, 68, 70, 72, 74 and 76 are coupled to and receive VTST. Testability devices 66, 68, 70 and 72 are coupled above or below cascode devices 46, 48, 50 and 52, respectively, and coupled to VTST, which is close to the voltage level of the cascode devices' gates (shown as VCG). VTST and VCG are each approximately one-half of VDDHV. If a cascode device of the level shifter 40 is shorted, the corresponding testability device detects current from VTST to ground or from VDDHV to VTST, depending on the logic state.

In operation of output buffer 10, n-channel devices do not pull their respective nodes higher than their respective gate voltages minus their respective threshold voltages. P-channel devices do not pull their respective nodes lower than their respective threshold voltages above their respective gate voltages.

In operation of level shifter 40, if data input 12 is low and enable input 14 is low, gate 80 of PCOD 58 is driven to approximately VDDHV and PCOD 58 is turned off. In the alternative, if data input 12 is high, gate 80 of PCOD 58 is driven to approximately one-half of VDDHV and PCOD 58 is on. The present invention contemplates shifting the gate voltage of PCOD 58 according to the values of data input 12 and enable input 14 in any suitable manner.

Referring to the switching circuitry, NCOC 62 has a threshold voltage (VT) and will not pull its source 82 above one VT below the voltage at its gate 84, which is maintained at approximately VCG, or approximately one-half of VDDHV. As a result, if output 16 is high at VDDHV and NCOD 64 is on according to the values of data input 12 and enable input 14, the voltage at node 82 goes low to ground, NCOC 62 is turned on, and the voltage across the gate oxide of NCOD 64 is not sufficient to overstress, break down, or damage this gate oxide. If output 16 is high at VDDHV and NCOD 64 is off according to the values of data input 12 and enable input 14, the voltage at node 82 is pulled up to the voltage at node 84 minus VT, whereupon NCOC 62 is turned off, and the voltages across the gate oxide of NCOD 64 are again less than the maximum that the gate oxide can tolerate.

PCOC 60 operates in a similar manner to protect the gate oxide of PCOD 58 if output 16 goes to ground. PCOC 60 has a threshold voltage (VT) and will not pull its source to below its gate voltage plus one VT, which is maintained at VCG, which is approximately one-half of VDDHV. The body of PCOC 60 is additionally coupled to and receives VDDHV from power supply 2. If output 16 goes to ground, the voltage at node 86 is not allowed to go lower than one-half VDDHV plus VT due to PCOC 60, and the voltage from node 86 to node 80 (which is at VDDHV due to level shifter 40) across the gate oxide of PCOD 58 is less than the maximum the gate oxide can tolerate without overstressing, breaking down, or otherwise being damaged.

In operation of level shifter 40, if data input 12 is high and enable input 14 is low, NCOD 64 is off, switching n-channel 54 is off, switching n-channel 56 is on, p-channel pull-up 42 is on, p-channel pull-up 44 is off, PCOD 58 is on, and output 16 is driven high to approximately VDDHV in an asserted state. As a result, the value of data input 12 is effectively transmitted through output buffer 10 to output 16. Alternatively, if data input 12 is low and enable input 14 is low, NCOD 64 is on, switching n-channel 54 is on, switching n-channel 56 is off, p-channel pull-up 42 is off, p-channel pull-up 44 is on, PCOD 58 is off, and output 16 is low or at ground in an asserted state. Finally, if enable input 14 is high, whether data input 12 is high or low, NCOD 64 is off, switching n-channel 54 is on, switching n-channel 56 is off, p-channel pull-up 42 is off, p-channel pull-up 44 is on, PCOD 58 is off, and output 16 is in a high-impedance non-asserted state with a variable value.

If enable input 14 is high, the voltages at nodes 86 and 82 will depend on the value of output 16, which may vary according to the operation of the electronic device associated with output buffer 10. For the arrangement shown in FIG. 1, the voltage at node 86 may range from approximately 3.3V (VDDHV) to approximately 1.65V (one-half of VDDHV) plus the VT associated with PCOD 58. The voltage at node 82 may range from zero (ground) to approximately VCG, or approximately 1.65V (approximately one-half of VDDHV) minus the VT associated with NCOD 64. The present invention contemplates other suitable voltages at nodes 86 and 82 according to the values of data input 12, enable input 14, and output 16 during operation of output buffer 10. This protection mechanism performed by PCOC 60 and NCOC 62 additionally applies to p-channel cascodes 46 and 48 and n-channel cascodes 50 and 52 of level shifter 40.

If the difference between VDDHV and VCG, which is approximately VCG when VCG is approximately one-half of VDDHV, is near the maximum gate oxide stress, then VCG is approximately the lowest fixed voltage a p-channel cascode gate can tolerate. Similarly, if VCG is near the maximum gate oxide stress, then VCG is approximately the highest fixed voltage that an n-channel cascode gate can tolerate. Putting VCG directly on the gates of PCOC 80, NCOC 84, p-channel cascodes 66 and 68, and n-channel cascodes 70 and 72 from the chip power supply allows for the elimination of bias generated voltages, and the DC current drawn by bias generators, to simplify output buffer 10. Putting VCG directly on the gates of these cascode devices also stabilizes their conductances, because VCG is more stable against transient voltage changes than the voltages generated using stacks of low-current devices such as those found in bias generators. As a result, if VCG is approximately one-half of VDDHV, whether VDDHV is approximately 3.3V and VCG is approximately 1.65V, VDDHV is approximately 5.0V and VCG is approximately 2.5V, or VDDHV and VCG have any other suitable values, VCG can be used as a reference voltage on cascode devices of output buffer 10 to provide these advantages without sacrificing circuit performance significantly.

Reference supply 8 may be a power supply or a bias generator circuit that produces a voltage of approximately VCG to gates of the p-channel cascodes 46 and 48 and n-channel cascodes 50 and 52 of level shifter 40, to PCOC 60, and to NCOC 62. In FIG. 1, gate 47 of p-channel cascodes 46 and 48, gate 51 of n-channel cascodes 50 and 52, gate 61 of PCOC 60, and gate 84 of NCOC 62 are all coupled to reference supply 8 to receive VCG. In one embodiment, VDDHV is equal to approximately 3.3V and VCG is equal to approximately 1.8V or approximately one-half of VDDHV. As a result of this arrangement, the voltages across the gate oxide of PCOD 58 and the gate oxide of NCOD 64 are approximately VCG or 1.8V and these gate oxides are not overstressed, broken down, or otherwise damaged due to voltage swings on output 16 according to the values of data input 12 and enable input 14.

In one embodiment, each testability device 66, 68, 70, 72, 74 and 76 is a diode-connected p-channel field effect transistor (diode-PFET), although output buffer 10 may have any suitable combination of diode-PFET or diode n-channel field effect transistor (diode-NFET) devices for use as testability devices. The operation of testability devices 66, 68, 70, 72, 74 and 76 is discussed using testability devices 66 and 70 as examples, although it should be understood that this discussion applies equally to other testability devices of output buffer 10.

Referring to level shifter 40, if p-channel cascode 46 is shorted or stuck "on" for some reason, the voltage at node 88 can fall to ground. In this case, output buffer 10 may continue to function, in whole or in part, even though the gate oxides of p-channel pull-ups 42 and 44 may be overstressed. Testability device 66 draws or otherwise generates current from power supply 4 at VTST to indicate failure of p-channel cascode 46. Similarly, if n-channel cascode 50 is shorted, the voltage at node 89 can rise to VDDHV, which may overstress the gate oxide of switching n-channel 54. In this situation, testability device 70 draws current from power supply 2 at VDDHV to power supply 4 at VTST that is detectable as changes in current on power supplies 2 and 4 to indicate failure of n-channel cascode 50. Testability devices 68 and 72 operate in a similar manner to draw current on power supply 4 to indicate failure of p-channel cascode 48 or n-channel cascode 52, respectively.

The present invention contemplates detecting failure of p-channel cascade 46, p-channel cascade 48, n-channel cascode 50, and n-channel cascode 52, singly or in any suitable combination, using testability devices 66, 68, 70 and 72, respectively. In one embodiment, detection of multiple concurrent failures may require measurement of current changes on power supply 2 instead of, or in addition to, measurement of current changes on power supply 4 as discussed above. For example, if p-channel cascade 46 and n-channel cascade 52 both fail, or if p-channel cascade 48 and n-channel cascade 50 both fail, current may flow to power supply 4 as a result of one failure and from power supply 4 as a result of the other failure to substantially balance any increased or decreased current on power supply 4 that would otherwise be detectable. In this situation, measurement of the current on power supply 2 will indicate failure of either pair of cascade devices, because there will be a current change on power supply 2 even though no current change on power supply 4 is apparent due to this balancing. Increased or decreased current on power supply 2, power supply 4, or both power supply 2 and power supply 4 may be detected to indicate multiple failure modes of cascade devices of output buffer 10.

In another embodiment, output buffer 10 could appear to function, in whole or in part, even if p-channel cascade 46 is shorted between node 88 and node 85 or is damaged or susceptible to failure to turn off, due to a processing defect or for any other reason. Such a failure of p-channel cascode 46 will prevent p-channel cascode 46 from properly protecting the gate oxide of p-channel pull-up 42. Detecting that p-channel cascode 46 is shorted using testability device 66 allows for detection of potential damage to the gate oxide of p-channel pull-up 42.

Figure 2:
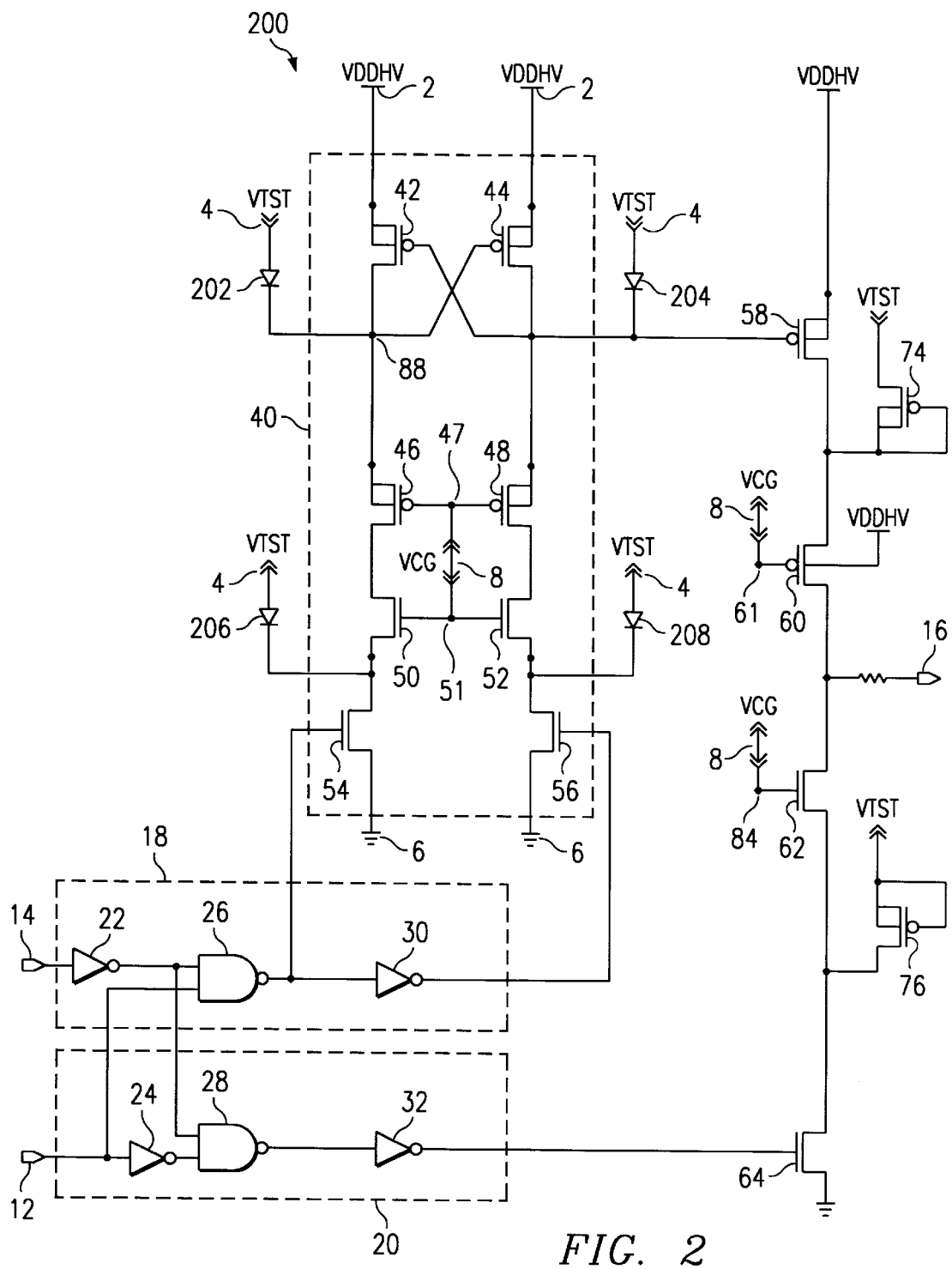
FIG. 2 is a schematic diagram of a second output buffer circuit constructed in accordance with the present invention.

Using testability device 66 as an example, the drain region of testability device 66 receives VTST, which typically equals VCG. If p-channel cascade 46 is functioning properly, p-channel cascade 46 will not pull node 88 below VTST and testability device 66 will not draw current. If p-channel cascade 46 is shorted between nodes 88 and 85 as in a typical failure mode, node 88 will follow node 85 below VTST and the current that testability device 66 draws is detectable as increased current on VTST. Monitoring the current at VTST allows for the detection of failure of p-channel cascade 46. Testability device 70 operates in a similar manner to draw current detectable on VTST to indicate failure of n-channel cascode 50 and the potential for damage to the gate oxide of switching n-channel 54. The present invention contemplates testability devices 66 and 70 cooperating in any suitable manner to indicate failure of p-channel cascode 46 or n-channel cascode 50, respectively. Although the testability devices of level shifter 40 are discussed as drawing current in response to failure of an associated device, the testability devices may generate current in any direction to indicate such failure. An alternative embodiment is shown in FIG. 2. The output buffer 200 has the same pre-driver logic 18 and 20, level shifter 40 and switching driver circuitry 58, 60, 62 and 64 as output buffer 10 of FIG. 1. Output buffer 200, however, includes diodes, rather than field effect transistors, as testability devices. These diodes could be drain-junction, Schottky or other suitable diodes.

In one embodiment, each testability device 202, 204, 206 and 208 is a diode, although output buffer 200 may have any suitable combination of diode-PFET devices, diode-NFET devices or diodes for use as testability devices. The operation of testability devices 202, 204, 206 and 208 is discussed using testability device 202 as an example, although it should be understood that this discussion applies equally to other testability devices of output buffer 200.

Referring to level shifter 40, if p-channel cascode 46 is shorted or stuck "on" for some reason, the voltage at node 88 can fall to ground. In this case, output buffer 200 may continue to function, in whole or in part, even though the gate oxides of p-channel pull-ups 42 and 44 may be overstressed. Testability device 202 draws or otherwise generates current from power supply 4 at VTST to indicate failure of p-channel cascode 46. Similarly, if n-channel cascode 50 is shorted, the voltage at node 89 can rise to VDDHV, which may overstress the gate oxide of switching n-channel 54. In this situation, testability device 206 draws current from power supply 2 at VDDHV to power supply 4 at VTST that is detectable as changes in current on power supplies 2 and 4 to indicate failure of n-channel cascode 50. Testability devices 204 and 208 operate in a similar manner to draw current on power supply 4 to indicate failure of p-channel cascode 48 or n-channel cascode 52, respectively.

The present invention contemplates detecting failure of p-channel cascode 46, p-channel cascode 48, n-channel cascode 50, and n-channel cascode 52, singly or in any suitable combination, using testability devices 202, 204, 206 and 208, respectively. In one embodiment, detection of multiple concurrent failures may require measurement of current changes on power supply 2 instead of, or in addition to, measurement of current changes on power supply 4 as discussed above. For example, if p-channel cascode 46 and n-channel cascode 52 both fail, or if p-channel cascode 48 and n-channel cascode 50 both fail, current may flow to power supply 4 as a result of one failure and from power supply 4 as a result of the other failure to substantially balance any increased or decreased current on power supply 4 that would otherwise be detectable. In this situation, measurement of the current on power supply 2 will indicate failure of either pair of cascode devices, because there will be a current change on power supply 2 even though no current change on power supply 4 is apparent due to this balancing. Increased or decreased current on power supply 2, power supply 4, or both power supply 2 and power supply 4 may be detected to indicate multiple failure modes of cascode devices of output buffer 200.

Although the present invention has been described above in connection with several embodiments, it should be understood that changes, substitutions, variations, alterations, transformations, and modifications may be suggested to one skilled in the art, and it is intended that the present invention encompass such changes, variations, substitutions, alterations, transformations, and modifications as fall within the spirit and scope of the appended claims.

What is claimed is:

1. A method for testing a level shifter having a plurality of cascode devices, the level shifter operable to couple a data input and an enable input to an output buffer and operable to receive a first voltage from a first reference supply and a second voltage from a second reference supply, comprising:

coupling a testability device to a cascode device of the level shifter and to a substantially constant test reference supply; and detecting a test current in response to failure of the cascode device.

2. The method of claim 1, wherein the step of detecting comprises detecting a change in current on the test reference supply.

3. The method of claim 1, wherein the voltage generated by the test reference supply is approximately equal to the second voltage when the second reference supply is supplying power to the output buffer.

4. The method of claim 1, wherein the second voltage is approximately equal to one half of the first voltage.

5. The method of claim 1, wherein the testability device is a diode-connected metal oxide semiconductor field effect transistor (MOSFET).

6. The method of claim 1, wherein the testability device is a diode.

7. The method of claim 6, wherein the diode is a drain-junction diode.

8. The method of claim 7, wherein the drain-junction diode is a Schottky diode.

9. The method of claim 1, wherein the testability device is operable to conduct a current from a voltage supply through a failed cascode device.

10. The method of claim 1, further comprising coupling a first cascode to the output of the level shifter and to a first cross-coupled p-channel having a gate oxide, the first cascode having a gate maintained at a first substantially constant voltage, the first cascode operable to protect the gate oxide of the first cross-coupled p-channel from voltage drops on a shared node.

11. The method of claim 10, further comprising coupling a second cascode to the gate of the first cross-coupled p-channel and to a second cross-coupled p-channel having a gate oxide, the second cascode having a gate maintained at a second substantially constant voltage, the second cascode operable to protect the gate oxide of the second cross-coupled p-channel from voltage drops on the shared node.

12. The method of claim 11, wherein the first and second substantially constant voltages are substantially the same.

13. The method of claim 11, in response to a multiple cascode failure such that a net current in the test reference supply is approximately zero, further comprising providing current detectable on an upper power supply coupled to the cross-coupled p-channel.

* * * * *